(12) United States Patent
Hung et al.

(10) Patent No.: US 7,786,023 B2
(45) Date of Patent: Aug. 31, 2010

(54) METAL PAD FORMATION METHOD AND METAL PAD STRUCTURE USING THE SAME

(75) Inventors: Yung-Tai Hung, Chiayi (TW); Jen-Chuan Pan, Kaohsiung (TW); Chin-Ta Su, Yunlin (TW); Ta-Hung Yang, Miaoli (TW)

(73) Assignee: Macronix International Co., Ltd., Hsinchu (TW)

( * ) Notice: Subject to any disclaimer, the term of this patent is extended or adjusted under 35 U.S.C. 154(b) by 280 days.

(21) Appl. No.: 11/819,011

(22) Filed: Jun. 25, 2007

(65) Prior Publication Data

US 2008/0315420 A1    Dec. 25, 2008

(51) Int. Cl.
*H01L 21/31* (2006.01)

(52) U.S. Cl. .................. 438/785; 438/758; 438/622; 438/605; 438/612; 438/631; 438/633; 438/637; 438/638; 438/648; 257/E21.577; 257/E21.579

(58) Field of Classification Search ............. 438/622, 438/631, 633, 638, 648; 257/758, E21.577, 257/579
See application file for complete search history.

(56) References Cited

U.S. PATENT DOCUMENTS

| | | | |
|---|---|---|---|
| 6,297,563 B1 * | 10/2001 | Yamaha | 257/781 |
| 2004/0183129 A1 * | 9/2004 | Williams et al. | 257/330 |

* cited by examiner

*Primary Examiner*—Charles D Garber
*Assistant Examiner*—Yasser A Abdelaziez
(74) *Attorney, Agent, or Firm*—Bacon & Thomas, PLLC

(57) ABSTRACT

A metal pad formation method and metal pad structure using the same are provided. A wider first pad metal is formed together with a first metal. A dielectric layer is then deposited thereon. A first opening and a second opening are formed in the dielectric layer to respectively expose the first metal and the first pad metal. Then, the first opening is filled by W metal to generate a first via. Finally, a second metal and a second pad metal are formed to respectively cover the first via and the first pad metal to generate the metal pad.

21 Claims, 4 Drawing Sheets

METAL PAD FORMATION METHOD AND METAL PAD STRUCTURE USING THE SAME

BACKGROUND OF THE INVENTION

1. Field of the Invention

The invention relates in general to a method for forming a metal pad on a semiconductor Pre-Metal Dielectric (PMD) and metal pad structure using the same, and more particularly to a method for forming a metal pad on a semiconductor Pre-Metal Dielectric (PMD) which combines tungsten (W) chemical mechanic polishing (CMP) and etching back for thickness reduction of top metal and metal pad structure using the same.

2. Description of the Related Art

FIGS. 1A and 1B are schematic diagrams of the conventional top metal formation for a metal pad. As shown in FIG. 1A, after the formation of first metals 102 on a semiconductor Pre-Metal Dielectric (PMD) 100, a dielectric layer 110 is deposited to cover the first metals 102 and the semiconductor Pre-Metal Dielectric (PMD) 100 and vias 112 are formed in the dielectric layer 110. Then, a metal layer 120 is deposited to cover the vias 112 and the dielectric layer 110. Afterward, as shown in FIG. 1B, a lithography operation is performed on the metal layer 120 to form a few second metals (top metals) 130 covering the vias 112 and separated from each other.

Owing that these second metals 130 are used for a metal pad in a wafer acceptance test and package of the semiconductor Pre-Metal Dielectric (PMD) 100, normally, the second metals 130 have to be thick enough, such as 6 KA, such that the probe card would not penetrate the second metals 130 in the wafer acceptance test.

However, due to the thickness limitation of the second metals 130, after a passivation layer 140 is formed, a lot of passivation cracks 142 are often formed between the second metals 130 as shown in FIG. 1C.

Besides, due to the large thickness of the second metals 130, after the fill-in process of the passivation layer 140, the second metals 130 in an array-like pattern are usually collapsed (stress induce) as shown in FIG. 1D. As a result, a metal bridge issue (due to collapse) occurs between the second metals 130 to reduce the electric isolation effect.

As mentioned above, due to the passivation crack issue and the metal bridge issue, the reliability in electrical test of the semiconductor Pre-Metal Dielectric (PMD) 100 through the metal pad (second metals 130) is largely reduced.

SUMMARY OF THE INVENTION

The invention is directed to a metal pad formation method. By forming a wider first metal, and a wider opening on the wider first metal for depositing a wider second metal, a metal pad can be generated and the thickness of the second pad metal can be reduced to solve the above passivation crack issue and the metal bridge issue.

According to the present invention, a method for forming a metal pad on a substrate is provided. The method comprises (a) forming a first metal and a first pad metal separated from each other on the substrate, wherein the first pad metal is wider than the first metal; (b) depositing a dielectric layer on the first metal, the first pad metal and the substrate; (c) forming a first opening and a second opening in the dielectric layer to respectively expose the first metal and the first pad metal; (d) filling the first opening with W metal to generate a first via; and (e) forming a second metal covering the first via and a second pad metal covering the first pad metal with the second metal and the second pad metal separated from each other, wherein the first pad metal and the second pad metal form the metal pad.

According to the present invention, a metal pad structure is provided. The metal pad structure comprises a first metal, a first pad metal, a dielectric layer, a second metal and a second pad metal. The first metal is formed on a substrate. The first pad metal is formed on the substrate and separated from the first metal. The first pad metal is wider than the first metal. The dielectric layer is formed on the substrate and covering the first metal. The dielectric layer comprises a via connected to the first metal and an opening on the first pad metal. The second metal is formed on the dielectric layer and connected to the via. The second pad metal is formed in the opening and covering the first pad metal. The second metal is separated from the second pad metal, the second pad metal has a level lower than the second metal, and the first pad metal and the second pad metal form a metal pad.

The invention will become apparent from the following detailed description of the preferred but non-limiting embodiments. The following description is made with reference to the accompanying drawings.

DETAILED DESCRIPTION OF THE INVENTION

The invention provides a method for forming a metal pad on a semiconductor Pre-Metal Dielectric (PMD) and metal pad structure using the same. A first pad metal wider than normal first metals is formed and an opening wider than normal openings for forming vias on the first metals is formed on the first pad metal. A second pad metal is deposited in the wider opening later for combining with the first pad metal to generate the required metal pad. Therefore, the metal layer required for forming the second pad metal can have a smaller deposition thickness to prevent generation of the passivation crack and metal bridge issues.

Figure 1A:
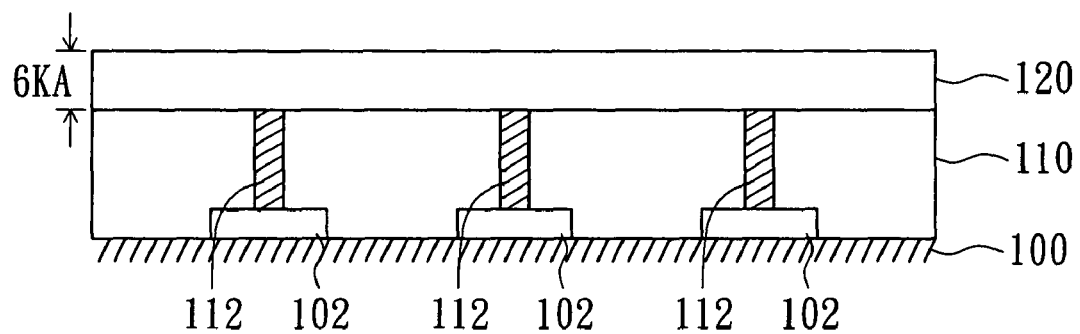
FIGS. 1A and 1B are schematic diagrams of the conventional top metal formation for a metal pad.
Figure 1B:
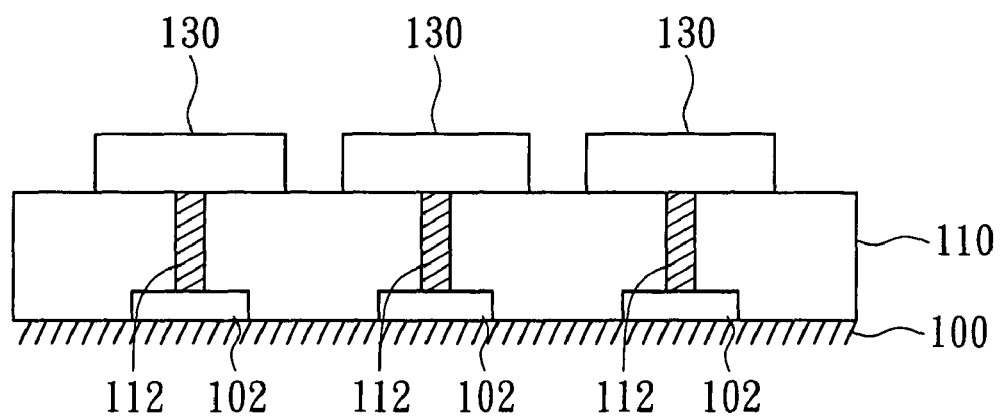
Figure 1C:
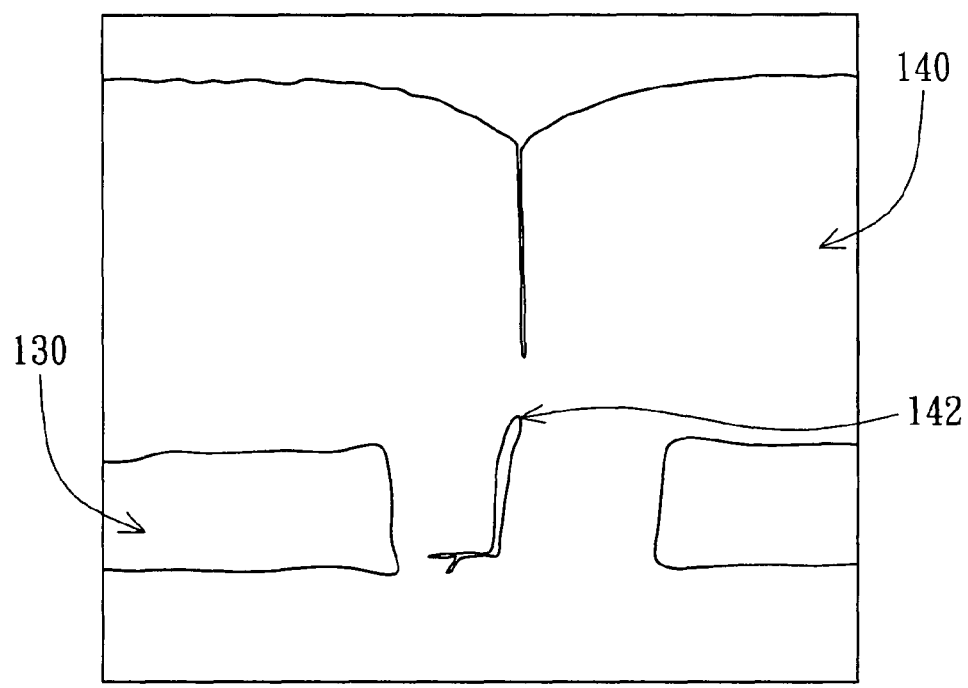
FIG. 1C is a schematic diagram of passivation cracks occurred in the conventional metal pad structure.
Figure 1D:
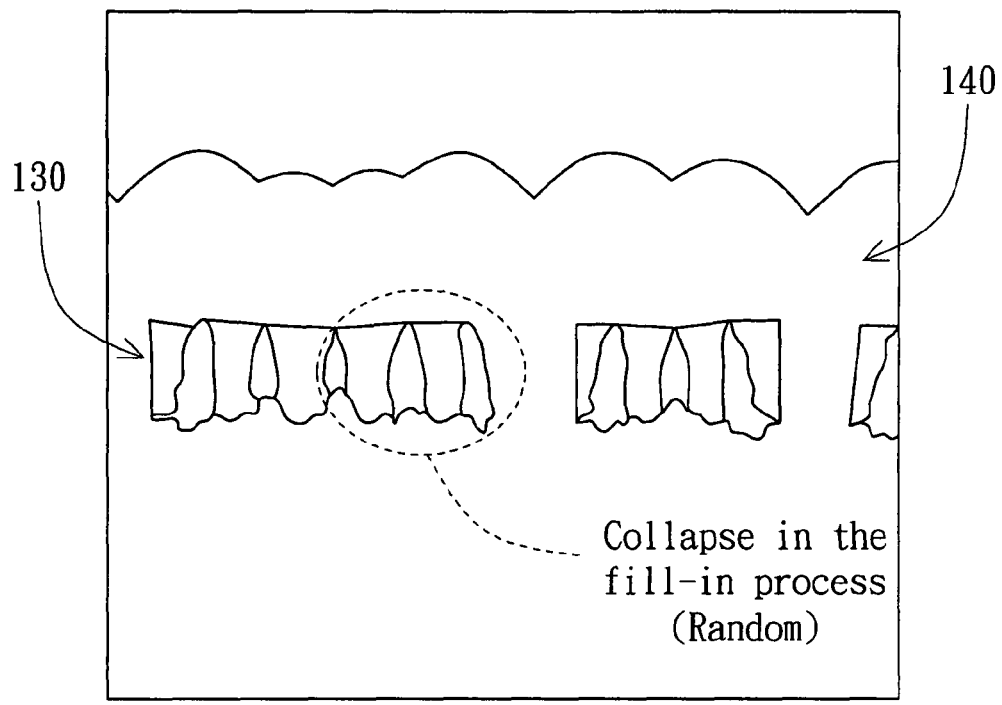
FIG. 1D is a schematic diagram of metal collapse occurred in the conventional array metal structure.
Figure 2A:
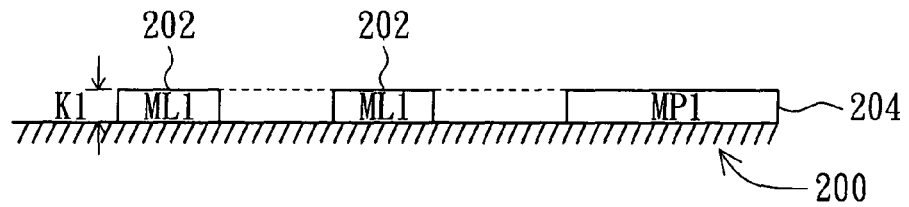
FIGS. 2A~2H are schematic diagrams of a process for forming a metal pad on a semiconductor Pre-Metal Dielectric (PMD) according to a preferred embodiment of the invention.

Referring to FIGS. 2A~2H, schematic diagrams of a process for forming a metal pad on a semiconductor Pre-Metal Dielectric (PMD) according to a preferred embodiment of the invention are shown. First, as shown in FIG. 2A, form first metals (ML1) 202 and a first pad metal (MP1) 204 separated from each other on a substrate 200, such as a Pre-Metal Dielectric (PMD), wherein the first pad metal 204 is wider than the first metals 202. For example, the first metals 202 and the first pad metal 204 are made of aluminum (Al) and are formed by sputtering. The first metals 202 and the first pad metal 204 have a thickness K1, which is 1 KA~4 KA and 1.5 KA preferably. The first pad metal 204 has a length and width 50 um~150 um and has an area of 80 um×80 um preferably.

Figure 2B:
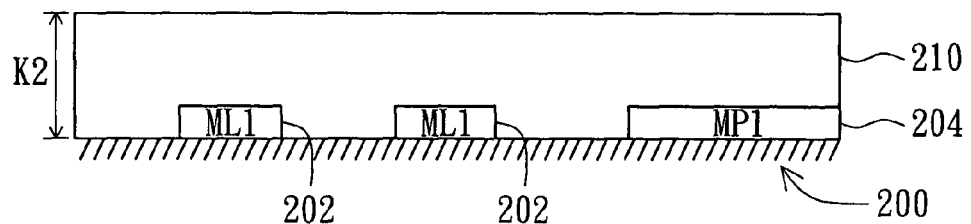
Figure 2C:
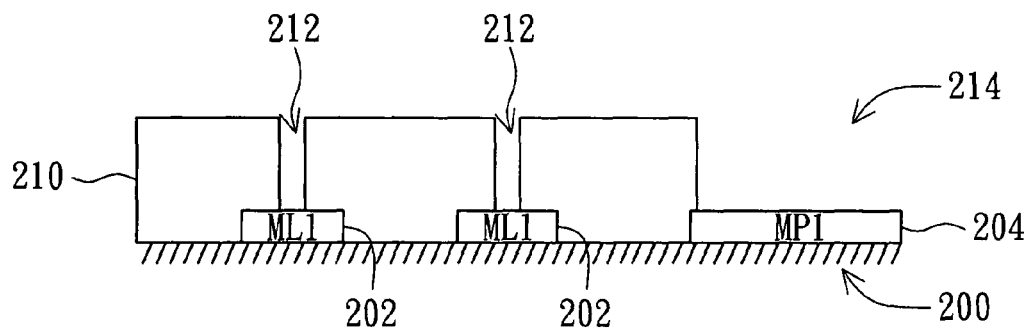

Following that, as shown in FIG. 2B, deposit a dielectric layer 210, such as made of silicone dioxide ($SiO_2$), on the first metals 202, the first pad metal 204, and the substrate 200. For example, the dielectric layer 210 is deposited by chemical vapor deposition (CVD). The thickness K2 of the dielectric layer 210 is 5 KA~7 KA. Next, as shown in FIG. 2C, form first openings 212 and a second opening 214 in the dielectric layer 210 to respectively expose the first metals 202 and the first pad metal 204. For example, the first openings 212 and the second opening 214 are formed by performing a lithography operation on the dielectric layer 210. The cross-sectional area of the second opening 214 is slightly smaller than the cross-sectional area of the first pad metal 204, and thus the second opening 214 is naturally wider than the first openings 212.

Figure 2D:
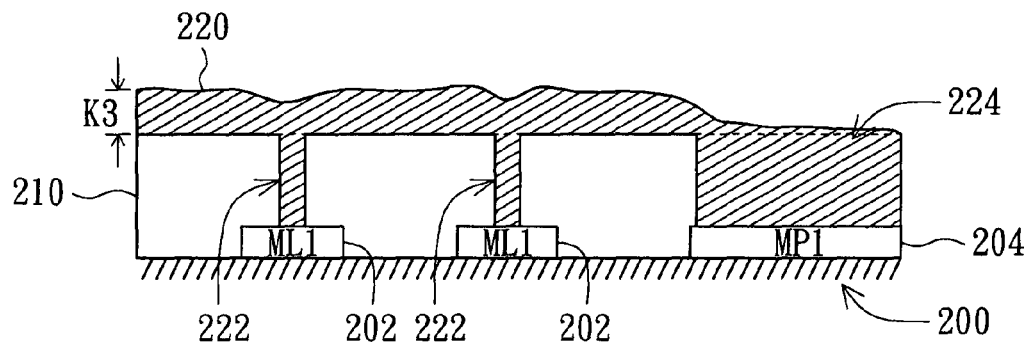

Afterwards, as shown in FIG. 2D, deposit a W layer 220 on the dielectric layer 210 and fill the first openings 212 and the second opening 214 with W metal to respectively generate first vias 222 and a second via 224. For example, the W layer 220 is deposited by low pressure CVD (LPCVD) and the thickness K3 of the W layer 220 above the dielectric layer 210 is about 3.5 KA. Owing that the second opening 214 is wider than the first opening 212, the second via 224 is also wider than the first vias 222, and the W layer on the second via 224 has a level lower than that on the dielectric layer 210 and the first vias 222. Here, the W metal is a material with better hole filling ability and is very suitable for via formation in small line-width process.

Figure 2E:
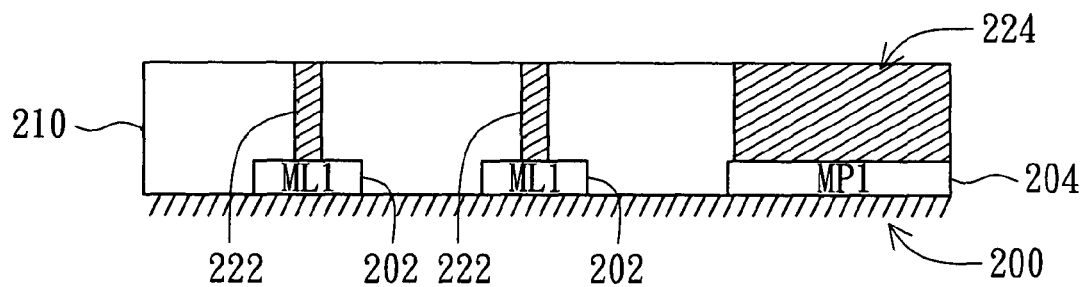

Then, as shown in FIG. 2E, perform a chemical mechanical polishing (CMP) operation on the W layer 220 to clear out the W metal on the dielectric layer 210 and expose the first vias 222 and the second via 224. For semiconductor process with line-width smaller than 0.25 um, the CMP technology is very good for providing a global planarization of the dielectric layer 210 after the W deposition.

Figure 2F:
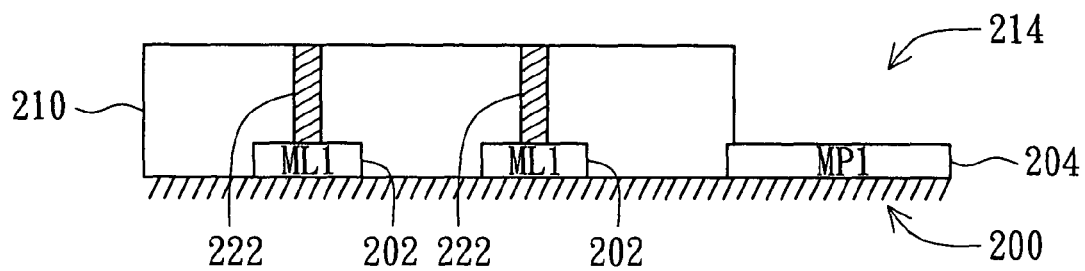

Next, as shown in FIG. 2F, perform an etching back operation on the second via 224 to clear out the W metal from the second via 224 and expose the first pad metal 204 again. For example, this process is performed by lithography in which a photoresist layer (not shown in the figure) is formed on the dielectric layer 210 first and then etched to expose only the second via 224. The etching back operation is continuously performed, such as by using SF6, O2, Ar, N2 gas, to clear out the W metal from the second via 224 to expose the first pad metal 204 again. After that, the remained photoresist layer is removed as shown in FIG. 2F.

Figure 2G:
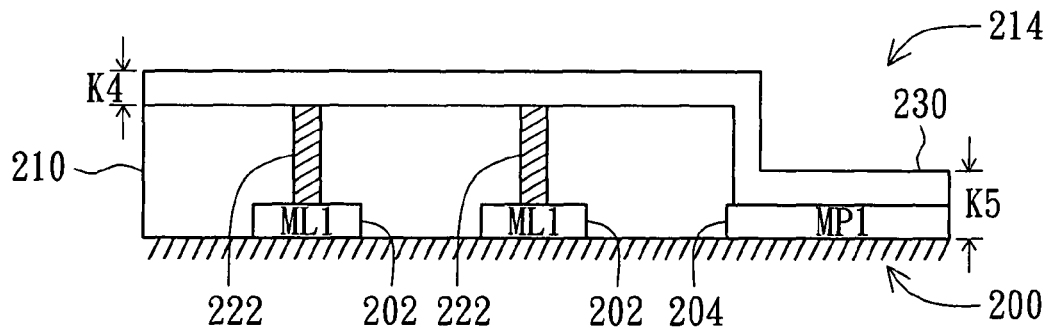

Next, as shown in FIG. 2G, deposit a metal layer 230 on the dielectric layer 210 to cover the dielectric layer 210, the first vias 222 and the second opening 214. For example, the metal layer 230 is made of aluminum (Al) and deposited by sputtering. The metal layer 230 has a thickness K4, which is 2.5 KA~6 KA and 3.5 KA preferably.

Figure 2H:
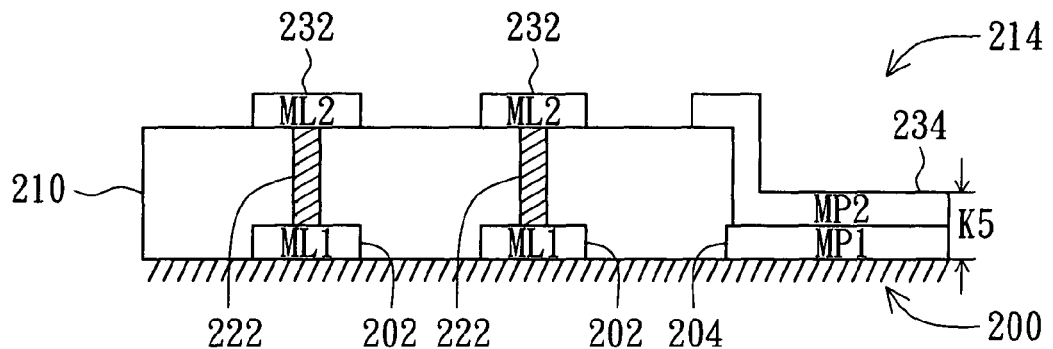

Finally, as shown in FIG. 2H, perform a lithography operation on the metal layer 230 to form second metals (ML2) (top metals) 232 covering the first vias 222 and a second pad metal (MP2) (top metal) 234 covering the first pad metal 204 with the second metals 232 and the second pad metal 234 separated from each other. The second pad metal 234 is formed to also cover the inner wall of the second opening 214. The first pad metal 204 and the second pad metal 234 form a metal pad for an electrical test of the semiconductor device.

As shown in FIG. 2H, a metal pad structure of the invention includes the first metal (ML1) 202, the first pad metal (MP1) 204, the dielectric layer 210, the second metal (ML2) 232 and the second pad metal (MP2) 234. The first metal 202 is formed on the substrate 200, such as a pre-metal dielectric (PMD). The first pad metal 204 is formed on the substrate 200 and separated from the first metal 202. The first pad metal 204 is wider than the first metal 202. The dielectric layer 210 is formed on the substrate 200 and covering the first metal 202. The dielectric layer 210 includes a via (i.e. the first via 222) connected to the first metal 202 and an opening (i.e. the second opening 214) on the first pad metal 204. The second metal 232 is formed on the dielectric layer 210 and connected to the first via 222. The second pad metal 234 is formed in the second opening 214 and covering the first pad metal 204. The second metal 232 is separated from the second pad metal 234, the second pad metal 234 has a level lower than the second metal 232, and the first pad metal 204 and the second pad metal 234 form a metal pad.

The total thickness K5 of the first pad metal 204 and the second pad metal 234 is larger than 5 KA, and thus the metal pad will not be penetrated in the electrical test. Owing that the metal pad is combined by the first pad metal 204 and the second pad metal 234 in the embodiment, if the first pad metal 204 has the thickness K1 about 1.5 KA, the second pad metal 234 needs to have the thickness K4 about 3.5 KA to have the thickness K5 (>5 KA) of the metal pad. Therefore, the metal layer 230 deposited for forming the second pad metal 234 only needs to have the thickness K4 about 3.5 KA. Owing that the metal layer 230 to be formed can be thinner, the above passivation crack and metal bridge issues can be prevented.

The metal pad formation method and metal pad structure using the same disclosed by the above embodiment of the invention forms a first pad metal wider than normal first metal, forms an opening in the dielectric layer wider than normal openings for forming vias on the first metals and then forms a second pad metal on the first pad metal to generate the required metal pad after W deposition, W CMP and etching back operations. By doing this, a thinner second pad metal is required and thus the passivation cracks and residues between the second metals and second pad metal can be greatly reduced to solve the passivation crack and metal bridge issues and improve the electrical test effect of the semiconductor device.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for forming a metal pad on a substrate, comprising:
    (a) forming a first metal and a first pad metal separated from each other on the substrate, wherein the first pad metal is wider than the first metal;
    (b) depositing a dielectric layer on the first metal, the first pad metal and the substrate;
    (c) forming a first opening and a second opening in the dielectric layer to respectively expose the first metal and the first pad metal;
    (d) depositing a conductive layer on the dielectric layer to fill the first opening and the second opening;
    (e) performing a chemical mechanic polishing (CMP) operation on the conductive layer to clear out the conductive layer on the dielectric layer and expose a surface of the dielectric layer;
    (f) performing an etching back process to clear out all the conductive layer in the second opening to expose the first pad metal; and
    (g) forming a second pad metal covering the first pad metal, wherein the first pad metal and the second pad metal form the metal pad.

2. The method according to claim 1, wherein the substrate is a pre-metal dielectric (PMD) substrate.

3. The method according to claim 1, wherein the first metal and the first pad metal are made of aluminum (Al).

4. The method according to claim 3, wherein the first metal and the first pad metal are formed by sputtering in the step (a).

5. The method according to claim 1, wherein the first metal and the first pad metal have a thickness 1 KA~4 KA.

6. The method according to claim 1, wherein the first pad metal has a length and width 50 um~150 um.

7. The method according to claim 1, wherein the dielectric layer is made of silicone dioxide (SiO2).

8. The method according to claim 1, wherein the dielectric layer is formed by chemical vapor deposition (CVD) in the step (b).

9. The method according to claim 1, wherein the dielectric layer has a thickness 5 KA~7 KA.

10. The method according to claim 1, wherein the first opening and the second opening are formed by lithography in the step (c).

11. The method according to claim 1, wherein a cross-sectional area of the second opening is smaller than a cross-sectional area of the first pad metal and larger than a cross-sectional area of the first opening.

12. The method according to claim 1, wherein the step (d) is performed by low pressure CVD (LPCVD).

13. The method according to claim 1, wherein the thickness of the conductive layer above the dielectric layer is about 3.5 KA.

14. The method according to claim 1, wherein the conductive layer is made of tungsten (W).

15. The method according to claim 1, wherein the etching back operation is performed by using SF6, O2, Ar, N2 gas.

16. The method according to claim 1, wherein the step (g) comprises:
    depositing a metal layer on the dielectric layer to cover the dielectric layer and the second opening; and
    performing a lithography operation on the metal layer to form the second pad metal covering the first pad metal.

17. The method according to claim 16, wherein the metal layer is deposited by sputtering in the step (g).

18. The method according to claim 16, wherein the metal layer is made of aluminum (Al).

19. The method according to claim 16, wherein the metal layer has a thickness 2.5 KA~6 KA.

20. The method according to claim 1, wherein the total thickness of the first pad metal and the second pad metal is larger than 5 KA.

21. The method according to claim 1, wherein the second pad metal is formed to cover an inner wall of the second opening in the step (g).

* * * * *